United States Patent [19]
Fujino

[11] Patent Number: 5,801,604
[45] Date of Patent: Sep. 1, 1998

[54] MAGNETOSTATIC WAVE DEVICE WITH INDIUM/TIN IN THE MAGNETIC GARNET

[75] Inventor: Masaru Fujino, Otsu, Japan

[73] Assignee: Murata Manufacturing Co., Ltd., Kyoto, Japan

[21] Appl. No.: 781,701

[22] Filed: Jan. 10, 1997

[30] Foreign Application Priority Data

Jan. 11, 1996 [JP] Japan ................................ 8-022146
Jan. 11, 1996 [JP] Japan ................................ 8-022147

[51] Int. Cl.$^6$ ........................................................ H03H 9/24
[52] U.S. Cl. ...................... 333/202; 252/62.58; 252/62.59
[58] Field of Search ........................ 333/202; 252/62.58, 252/62.59

[56] References Cited

U.S. PATENT DOCUMENTS

| | | | |
|---|---|---|---|
| 3,886,077 | 5/1975 | Nicolas et al. | 252/62.58 X |
| 4,721,547 | 1/1988 | Nomura et al. | 117/7 |
| 4,968,954 | 11/1990 | Ryou et al. | 333/193 X |
| 5,466,388 | 11/1995 | Fuji et al. | 252/62.59 |

FOREIGN PATENT DOCUMENTS 55-143009  11/1980  Japan.

OTHER PUBLICATIONS

"Effect of Diamagnetic Substitution on Growth–Induced Anisotrophy in $(YBi)_3Fe_5O_{12}$", Journal of Applied Physics Letters, Jul. 15, 1986, (60) No. 2, pp. 718–720, American Institute of Physics, Woodbury, New York.

"Anomalies in the Temperature Dependence of Faraday Rotation on Yttrium Iron Garnets with Sn, Zr, or Sb", Journal of Applied Physics Letters, Nov. 15, 1991, (70) No. 10, Pt. II, pp. 6295–6297, American Institute of Physics, Woodbury, New York.

*Primary Examiner*—Robert J. Pascal
*Assistant Examiner*—Justin P. Bettendorf
*Attorney, Agent, or Firm*—Ostrolenk, Faber, Gerb & Soffen, LLP

[57] ABSTRACT

Disclosed therein is a magnetostatic wave device that employs a single-crystal thin film of magnetic garnet (which contains iron) characterized in that the magnetic garnet has incorporated indium or tin in an amount of about 10 to 3000 ppm (by weight).

8 Claims, 1 Drawing Sheet

MAGNETOSTATIC WAVE DEVICE WITH INDIUM/TIN IN THE MAGNETIC GARNET

BACKGROUND OF THE INVENTION

1. Field of the Invention

The present invention relates to a magnetostatic wave device.

2. Description of the Related Art

A magnetostatic wave device employs single-crystal thin film of magnetic garnet which has conventionally been YIG (yttrium iron garnet) represented by $Y_3Fe_5O_{12}$. YIG is characterized most by its extremely small ferromagnetic half-width ($\Delta H$). This leads to the fact that a magnetostatic wave device that employs a single-crystal thin film of magnetic garnet has little difference between its input signals and output signals. Another feature of YIG is that it becomes saturated upon application of input signals of comparatively small power. These characteristic properties permit a single-crystal thin film of YIG (as well as other iron-containing garnets) to be used widely for magnetostatic wave devices such as limiters and noise filters.

SUMMARY OF THE INVENTION

Recent electronic machines with a less power consumption than before need a new version of YIG which becomes saturated upon application of a very small input power.

Accordingly, it is a first object of the present invention to provide a high-performance magnetostatic wave device which becomes saturated upon application of a very small input power.

The fact that YIG becomes saturated upon application of input signals leads to a transient response, namely the phenomenon that saturation does not occur immediately after application of input signals, with input signals being outputted as such, and saturation takes place after a lapse of time. This transient response adversely affects the performance of the magnetostatic wave device.

Accordingly, it is a second object of the present invention to provide a high-performance magnetostatic wave device which is free from transient response (the phenomenon that input signals are outputted as such and saturation takes place with lapse of time).

The first aspect of the present invention resides in a magnetostatic wave device that employs a single-crystal thin film of magnetic garnet (which contains iron) characterized in that the magnetic garnet incorporates indium in an amount of about 10 to 3000 ppm (by weight), preferably at least about 500 ppm and more preferably at least about 1000 ppm.

The second aspect of the present invention resides in a magnetostatic wave device that employs a single-crystal thin film of magnetic garnet (which contains iron), characterized in that the magnetic garnet incorporates tin in an amount of about 10 to 3000 ppm (by weight), preferably at least about 500 ppm and more preferably at least about 1000 ppm.

It turned out that input power for saturation can be very small if a single-crystal thin film of YIG (as well as iron-containing magnetic garnet) for the magnetostatic wave device has incorporated indium in an amount of about 10 to 3000 ppm (by weight).

It also turned out that transient response can be minimized if single-crystal thin film of YIG (as well as iron-containing magnetic garnet) for the magnetostatic wave device has incorporated tin in an amount of about 10 to 3000 ppm (by weight).

The first aspect of the present invention is designed to make best use of YIG's capability of becoming saturated upon application of a very small input power, thereby providing a high-performance magnetostatic wave device.

The second aspect of the present invention makes best use of YIG's feature that saturation takes place without delay upon application of input signals of small power. This makes it possible to minimize the transient response, thereby enhancing the performance of the magnetostatic wave device.

These and other objects, advantages, and features of the invention may be readily ascertained by referring to the accompanying drawing and the following detailed description of embodiments and

DESCRIPTION OF THE PREFERRED EMBODIMENTS

Figure 1:
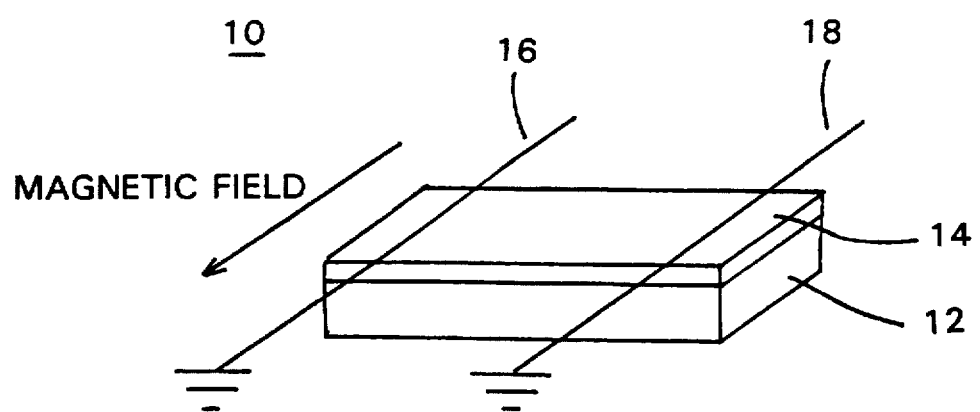
FIG. 1 is a perspective view showing one embodiment of the present invention.

FIG. 1 is a perspective view showing one embodiment of the present invention, which is a magnetostatic wave device 10. It is composed of a rectangular substrate 12 of $Gd_3Ga_5O_{12}$ and a rectangular single-crystal thin film 14 of magnetic garnet formed on one surface thereof. The magnetic garnet contains iron. On the surface of the single-crystal thin film 14 of magnetic garnet are placed an input terminal 16 and an output terminal 18 which are parallel to each other. These terminals have their ends grounded.

The magnetic garnet has a composition represented by $(Y_{3-x1-x2}R'_{x1}R''_{x2})(Fe_{5-y1-y2}M'_{y1}M''_{y2})O_{12}$, wherein $0 \leq x1 \leq 3$, $0 \leq x2 \leq 3$, $0 \leq x1+x2 \leq 3$, $0 \leq y1 < 5$, $0 \leq y2 \leq 3$, $0 \leq y1+y2 < 5$, and $x2=y2$;

R' is at least one member selected from Sc, Bi, and La series;

R'' is at least one member selected from the Mg, Ca, Sr, and Ba;

M' is at least one member selected from Al, Ga, and In; and

M'' is at least one member selected from Si, Ti, Zr, Hf, and Ge.

The first aspect of the present invention is demonstrated by Examples 1 to 3, and the second aspect of the present invention is demonstrated by Examples 4 to 6.

EXAMPLE 1

A garnet thin film was formed by liquid phase epitaxy (LPE) on a GGG substrate (gadolinium gallium garnet—$Gd_3Ga_5O_{12}$) in the following manner. First, $Fe_2O_3$ and $Y_2O_3$ as the raw materials of the garnet were mixed with $InO_2$ as an additive and $PbO-B_2O_3$ as a flux. Then the mixture was placed in a platinum crucible held in a vertical electric furnace and melted and homogenized at about 1200° C. The melt was cooled to and kept at about 900° C. so that garnet became supersaturated. Into this melt was dipped the GGG substrate, which was rotated for a prescribed period of time for crystal growth. Finally, the substrate was raised from the melt and then spun rapidly to remove the excess melt by centrifugal force. Thus was obtained the desired garnet thin film.

For comparison, the same procedure as above was repeated without the addition of the indium.

The thus obtained garnet thin film was fabricated into the magnetostatic wave device as shown in FIG. 1. The device was measured for the amount of input power (at 2 GHz) required for the device to become saturated. Also, the garnet film underwent chemical analysis to determine the content of indium. The results are shown in Table 1.

TABLE 1

| Sample No. | Content of indium in garnet thin film (ppm by weight) | Amount of input power for saturation (mW) |
|---|---|---|
| 1* | 0 | 3.2 |
| 2* | 5 | 3.0 |
| 3 | 10 | 1.5 |
| 4 | 500 | 1.3 |
| 5 | 1000 | 1.2 |
| 6 | 1500 | 1.0 |
| 7 | 3000 | 0.9 |
| 8* | 3100 | ** |

*Samples not conforming to the invention.
**No satisfactory thin film was obtained.

According to the present invention, the content of indium in the garnet is specified as above because a content less than about 10 ppm (by weight) is not enough to effectively contribute to saturation (as in Sample No. 2 which is similar to Sample No. 1 containing no indium) and a content in excess of about 3000 ppm (by weight) is unfavorable to the formation of good single-crystal thin film (as in Sample No. 8).

EXAMPLE 2

A garnet thin film was formed by LPE on a GGG substrate ($Gd_3Ga_5O_{12}$) in the following manner. First, $Fe_2O_3$, $Y_2O_3$, $Ga_2O_3$, and $La_2O_3$ as the raw materials of the garnet were mixed with $InO_2$ as an additive and $PbO-B_2O_3$ as a flux. The mixture was placed in a platinum crucible held in a vertical electric furnace and then melted and homogenized at about 1200° C. The melt was cooled to and kept at about 900° C. so that garnet became supersaturated. Into this melt was dipped the GGG substrate, which was rotated for a prescribed period of time for crystal growth. Finally, the substrate was raised from the melt and then spun rapidly to remove the excess melt by centrifugal force. Thus there was obtained the desired garnet thin film.

For comparison, the same procedure as above was repeated without the addition of indium.

The thus obtained garnet thin film was fabricated into the magnetostatic wave device as shown in FIG. 1. The device was measured for the amount of input power (at 2 GHz) required for the device to become saturated. Also, the garnet film underwent chemical analysis to determine the content of indium. The results are shown in Table 2.

TABLE 2

| Sample No. | Composition | Content of indium in garnet thin film (ppm by weight) | Amount of input power for saturation (mW) |
|---|---|---|---|
| 9* | $Y_{2.96}La_{0.04}Fe_{4.6}Ga_{0.4}O_{12}$ | 0 | 2.9 |
| 10* | $Y_{2.96}La_{0.04}Fe_{4.6}Ga_{0.4}O_{12}$ | 5 | 2.8 |
| 11 | $Y_{2.96}La_{0.04}Fe_{4.6}Ga_{0.4}O_{12}$ | 10 | 1.4 |
| 12 | $Y_{2.96}La_{0.04}Fe_{4.6}Ga_{0.4}O_{12}$ | 500 | 1.3 |
| 13 | $Y_{2.96}La_{0.04}Fe_{4.6}Ga_{0.4}O_{12}$ | 1000 | 1.2 |
| 14 | $Y_{2.96}La_{0.04}Fe_{4.6}Ga_{0.4}O_{12}$ | 1500 | 1.0 |
| 15 | $Y_{2.96}La_{0.04}Fe_{4.6}Ga_{0.4}O_{12}$ | 3000 | 0.9 |
| 16* | $Y_{2.96}La_{0.04}Fe_{4.6}Ga_{0.4}O_{12}$ | 3100 | ** |

*Samples not conforming to the invention.
**No satisfactory thin film was obtained.

According to the present invention, the content of indium in the garnet is specified as above because a content less than about 10 ppm (by weight) is not enough to effectively contribute to saturation (as in Sample No. 10 which is similar to Sample No. 9 containing no indium) and a content in excess of about 3000 ppm (by weight) is unfavorable to the formation of good single-crystal thin film (as in Sample No. 16).

EXAMPLE 3

A garnet thin film was formed by LPE on a GGG substrate ($Gd_3Ga_5O_{12}$) in the following manner. First, $Fe_2O_3$, $Y_2O_3$, $Ga_2O_3$, and $Bi_2O_3$ as the raw materials of the garnet were mixed with $InO_2$ as an additive and $PbO-B_2O_3$ as a flux. The mixture was placed in a platinum crucible held in a vertical electric furnace and then melted and homogenized at about 1200° C. The melt was cooled to and kept at about 900° C. so that garnet became supersaturated. Into this melt was dipped the GGG substrate, which was rotated for a prescribed period of time for crystal growth. Finally, the substrate was raised from the melt and then spun rapidly to remove the excess melt by centrifugal force. Thus there was obtained the desired garnet thin film.

For comparison, the same procedure as above was repeated without the addition of indium.

The thus obtained garnet thin film was fabricated into the magnetostatic wave device as shown in FIG. 1. The device was measured for the amount of input power (at 2 GHz) required for the device to become saturated. Also, the garnet film underwent chemical analysis to determine the content of indium. The results are shown in Table 3.

TABLE 3

| Sample No. | Composition | Content of indium in garnet thin film (ppm by weight) | Amount of input power for saturation (mW) |
|---|---|---|---|
| 17* | $Y_{2.8}Bi_{0.2}Fe_{4.55}Ga_{0.45}O_{12}$ | 0 | 3.0 |
| 18* | $Y_{2.8}Bi_{0.2}Fe_{4.55}Ga_{0.45}O_{12}$ | 5 | 2.8 |
| 19 | $Y_{2.8}Bi_{0.2}Fe_{4.55}Ga_{0.45}O_{12}$ | 10 | 1.4 |
| 20 | $Y_{2.8}Bi_{0.2}Fe_{4.55}Ga_{0.45}O_{12}$ | 500 | 1.3 |
| 21 | $Y_{2.8}Bi_{0.2}Fe_{4.55}Ga_{0.45}O_{12}$ | 1000 | 1.2 |
| 22 | $Y_{2.8}Bi_{0.2}Fe_{4.55}Ga_{0.45}O_{12}$ | 1500 | 1.1 |
| 23 | $Y_{2.8}Bi_{0.2}Fe_{4.55}Ga_{0.45}O_{12}$ | 3000 | 1.0 |
| 24* | $Y_{2.8}Bi_{0.2}Fe_{4.55}Ga_{0.45}O_{12}$ | 3100 | ** |

*Samples not conforming to the invention.
**No satisfactory thin film was obtained.

According to the present invention, the content of indium in the garnet is specified as above because a content less than about 10 ppm (by weight) is not enough to effectively contribute to saturation (as in Sample No. 18 which is similar to Sample No. 17 containing no indium) and a content in excess of about 3000 ppm (by weight) is unfavorable to the formation of good single-crystal thin film (as in Sample No. 24).

EXAMPLE 4

A garnet thin film was formed by liquid phase epitaxy (LPE) on a GGG substrate (gadolinium gallium garnet—$Gd_3Ga_5O_{12}$) in the following manner. First, $Fe_2O_3$ and $Y_2O_3$ as the raw materials of the garnet were mixed with $SnO_2$ as an additive and $PbO-B_2O_3$ as a flux. The mixture was placed in a platinum crucible held in a vertical electric furnace and then melted and homogenized at about 1200° C. The melt was cooled to and kept at about 900° C. so that garnet became supersaturated. Into this melt was dipped the GGG substrate, which was rotated for a prescribed period of time for crystal growth. Finally, the substrate was raised from the melt and then spun rapidly to remove the excess melt by centrifugal force. Thus there was obtained the desired garnet thin film.

For comparison, the same procedure as above was repeated without the addition of tin.

The thus obtained garnet thin film was fabricated into the magnetostatic wave device as shown in FIG. 1. The device was measured for time required for saturation to take place (at 2 GHz). Also, the garnet film underwent chemical analysis to determine the content of tin. The results are shown in Table 4.

TABLE 4

| Sample No. | Content of tin in garnet thin film (ppm by weight) | Time required for saturation to take place (ms) |
| --- | --- | --- |
| 1* | 0 | 124 |
| 2* | 5 | 123 |
| 3 | 10 | 80 |
| 4 | 500 | 68 |
| 5 | 1000 | 61 |
| 6 | 1500 | 55 |
| 7 | 3000 | 48 |
| 8* | 3100 | ** |

*Samples not conforming to the invention.
**No satisfactory thin film was obtained.

According to the present invention, the content of tin in the garnet is specified as above because a content less than about 10 ppm (by weight) is not enough to affect the time required for saturation to take place (as in Sample No. 2 which is similar to Sample No. 1 (YIG film) containing no tin) and a content in excess of about 3000 ppm (by weight) prevents saturation itself (as in Sample No. 8), making the magnetostatic wave device inoperable.

EXAMPLE 5

A garnet thin film was formed by LPE on a GGG substrate ($Gd_3Ga_5O_{12}$) in the following manner. First, $Fe_2O_3$, $Y_2O_3$, $Ga_2O_3$, and $La_2O_3$ as the raw materials of the garnet were mixed with $SnO_2$ as an additive and $PbO$-$B_2O_3$ as a flux. The mixture was placed in a platinum crucible held in a vertical electric furnace and then melted and homogenized at about 1200° C. The melt was cooled to and kept at about 900° C. so that garnet became supersaturated. Into this melt was dipped the GGG substrate, which was rotated for a prescribed period of time for crystal growth. Finally, the substrate was raised from the melt and then spun rapidly to remove the excess melt by centrifugal force. Thus there was obtained the desired garnet thin film.

For comparison, the same procedure as above was repeated without the addition of tin.

The thus obtained garnet thin film was fabricated into the magnetostatic wave device as shown in FIG. 1. The device was measured for time required for saturation to take place (at 2 GHz). Also, the garnet film underwent chemical analysis to determine the content of tin. The results are shown in Table 5.

TABLE 5

| Sample No. | Composition | Content of tin in garnet thin film (ppm by weight) | Time required for saturation to take place (ns) |
| --- | --- | --- | --- |
| 9* | $Y_{2.95}La_{0.05}Fe_{4.6}Ga_{0.4}O_{12}$ | 0 | 122 |
| 10* | $Y_{2.95}La_{0.05}Fe_{4.6}Ga_{0.4}O_{12}$ | 5 | 121 |
| 11 | $Y_{2.95}La_{0.05}Fe_{4.6}Ga_{0.4}O_{12}$ | 10 | 78 |
| 12 | $Y_{2.95}La_{0.05}Fe_{4.6}Ga_{0.4}O_{12}$ | 500 | 70 |
| 13 | $Y_{2.95}La_{0.05}Fe_{4.6}Ga_{0.4}O_{12}$ | 1000 | 60 |
| 14 | $Y_{2.95}La_{0.05}Fe_{4.6}Ga_{0.4}O_{12}$ | 1500 | 54 |
| 15 | $Y_{2.95}La_{0.05}Fe_{4.6}Ga_{0.4}O_{12}$ | 3000 | 49 |
| 16* | $Y_{2.95}La_{0.05}Fe_{4.6}Ga_{0.4}O_{12}$ | 3100 | ** |

*Samples not conforming to the invention.
**No satisfactory thin film was obtained.

According to the present invention, the content of tin in the garnet is specified as above because a content less than about 10 ppm (by weight) is not enough to affect the time required for saturation to take place (as in Sample No. 10 which is similar to Sample No. 9 containing no tin) and a content in excess of about 3000 ppm (by weight) prevents saturation itself (as in Sample No. 16), making the magnetostatic wave device inoperable.

EXAMPLE 6

A garnet thin film was formed by LPE on a GGG substrate ($Gd_3Ga_5O_{12}$) in the following manner. First, $Fe_2O_3$, $Y_2O_3$, $Ga_2O_3$, and $Bi_2O_3$ as the raw materials of the garnet were mixed with $SnO_2$ as an additive and $PbO$-$B_2O_3$ as a flux. The mixture was placed in a platinum crucible held in a vertical electric furnace and then melted and homogenized at about 1200° C. The melt was cooled to and kept at about 900° C. so that garnet became supersaturated. Into this melt was dipped the GGG substrate, which was rotated for a prescribed period of time for crystal growth. Finally, the substrate was raised from the melt and then spun rapidly to remove the excess melt by centrifugal force. Thus there was obtained the desired garnet thin film.

For comparison, the same procedure as above was repeated without the addition of tin.

The thus obtained garnet thin film was fabricated into the magnetostatic wave device as shown in FIG. 1. The device was measured for time required for saturation to take place (at 2 GHz). Also, the garnet film underwent chemical analysis to determine the content of tin. The results are shown in Table 6.

TABLE 6

| Sample No. | Composition | Content of tin in garnet thin film (ppm by weight) | Time required for saturation to take place (ns) |
| --- | --- | --- | --- |
| 17* | $Y_{2.8}Bi_{0.2}Fe_{4.6}Ga_{0.4}O_{12}$ | 0 | 125 |
| 18* | $Y_{2.8}Bi_{0.2}Fe_{4.6}Ga_{0.4}O_{12}$ | 5 | 122 |
| 19 | $Y_{2.8}Bi_{0.2}Fe_{4.6}Ga_{0.4}O_{12}$ | 10 | 79 |
| 20 | $Y_{2.8}Bi_{0.2}Fe_{4.6}Ga_{0.4}O_{12}$ | 500 | 70 |
| 21 | $Y_{2.8}Bi_{0.2}Fe_{4.6}Ga_{0.4}O_{12}$ | 1000 | 56 |
| 22 | $Y_{2.8}Bi_{0.2}Fe_{4.6}Ga_{0.4}O_{12}$ | 1500 | 50 |
| 23 | $Y_{2.8}Bi_{0.2}Fe_{4.6}Ga_{0.4}O_{12}$ | 3000 | 46 |
| 24* | $Y_{2.8}Bi_{0.2}Fe_{4.6}Ga_{0.4}O_{12}$ | 3100 | ** |

*Samples not conforming to the invention.
**No satisfactory thin film was obtained.

According to the present invention, the content of tin in the garnet is specified as above because a content less than about 10 ppm (by weight) is not enough to affect the time required for saturation to take place (as in Sample No. 18 which is similar to Sample No. 17 containing no tin) and a content in excess of about 3000 ppm (by weight) prevents saturation itself (as in Sample No. 24), making the magnetostatic wave device inoperable.

What is claimed is:

1. A magnetostatic wave device comprising a single-crystal thin film of iron-containing magnetic garnet characterized in that the magnetic garnet has added therein an amount of about 10 to 3000 ppm by weight of at least one member of the group consisting of indium and tin.

2. The magnetostatic wave device of claim 1 in which the member of the group is indium.

3. The magnetostatic wave device of claim 2 indium is added in an amount of at least about 500 ppm.

4. The magnetostatic wave device of claim 3 indium is added in an amount of at least about 1000 ppm.

5. A magnetostatic wave device of claim 1 in which the member of the group is tin.

6. The magnetostatic wave device of claim 5 tin is added in an amount of at least about 500 ppm.

7. The magnetostatic wave device of claim 5 tin is added in an amount of at least about 1000 ppm.

8. A magnetostatic wave device of claim 1 in which the magnetic garnet has a composition represented by $(Y_{3-x1-x2}R'_{x1}R''_{x2})(Fe_{5-y1-y2}M'_{y1}M''_{y2})O_{12}$, wherein $0 \leq x1 \leq 3$, $0 \leq x2 \leq 3$, $0 \leq x1+x2 \leq 3$, $0 \leq y1 < 5$, $0 \leq y2 \leq 3$, $0 \leq y1+y2 < 5$, and $x2=y2$; R' is at least one member selected from the group consisting of Sc, Bi and La; R" is at least one member selected from the group consisting of Mg, Ca, Sr and Ba; M' is at least one member selected from the group consisting of Al, Ga, and In; and M" is at least one member selected from the group consisting of Si, Ti, Zr, Hf, and Ge.

* * * * *